United States Patent
Glavish et al.

(10) Patent No.: US 6,673,148 B2
(45) Date of Patent: Jan. 6, 2004

(54) METHOD OF USING A MAGNETIC FIELD FURNACE TO MANUFACTURE SEMICONDUCTOR SUBSTRATES

(75) Inventors: Hilton F. Glavish, Incline Village, NV (US); Hideyuki Isozaki, Kanagawa-ken (JP); Keiji Maishigi, Kanagawa-ken (JP); Kentaro Fujita, Kanagawa-ken (JP)

(73) Assignee: Ebara Solar, Inc., Belle Vernon, PA (US)

(*) Notice: Subject to any disclaimer, the term of this patent is extended or adjusted under 35 U.S.C. 154(b) by 0 days.

(21) Appl. No.: 10/235,966

(22) Filed: Sep. 5, 2002

(65) Prior Publication Data

US 2003/0097978 A1 May 29, 2003

Related U.S. Application Data

(62) Division of application No. 09/750,935, filed on Dec. 29, 2000, now Pat. No. 6,482,261.

(51) Int. Cl.$^7$ .................................. C30B 15/20
(52) U.S. Cl. .................... 117/16; 117/23; 117/26; 117/217; 117/218
(58) Field of Search ............... 117/16, 23, 26, 117/217, 218

(56) References Cited

U.S. PATENT DOCUMENTS

| 4,533,428 A | 8/1985 | Grabmaier et al. |
| 4,563,976 A | 1/1986 | Foell et al. |
| 4,563,979 A | 1/1986 | Falckenberg et al. |
| 4,627,887 A | 12/1986 | Sachs |
| 4,661,200 A | 4/1987 | Sachs |
| 4,861,416 A | 8/1989 | Morrison |
| 4,934,446 A | 6/1990 | Winter |
| 4,971,650 A | 11/1990 | Spitznagel et al. |
| 5,766,346 A | 6/1998 | Hayashi et al. |
| 5,769,944 A | 6/1998 | Park et al. |
| 5,827,366 A | 10/1998 | Watanabe |
| 5,840,116 A | 11/1998 | Kubo |
| 5,858,084 A | 1/1999 | Lee et al. |
| 5,868,832 A | 2/1999 | Begg |
| 5,882,398 A | 3/1999 | Sonokawa et al. |
| 5,916,364 A | 6/1999 | Izumi |
| 5,928,438 A | 7/1999 | Salami et al. |
| 6,093,244 A | 7/2000 | Easoz et al. |

FOREIGN PATENT DOCUMENTS

| GB | 2 135 595 A | 9/1984 |
| GB | 2 198 966 A | 6/1988 |
| WO | WO 00/09784 | 2/2000 |

OTHER PUBLICATIONS

Barrett, D. L., et al.; "Growth of Wide, Flat Crystals of Silicon Web"; J. Electrochem. Soc.; Jun. 1971; pp. 952–957; vol. 118, No. 6.

Seidensticker, Raymond G.; "Dendritic Web Growth of Silicon"; Crystals: Growth, Properties and Applications; (Springer, Berlin 1982); 15 pages; vol. 8, Applications Ed. J. Grabmaier.

Hoshikawa, Keigo, DR., et al. "Development of Single–Crystal Growth Technique with Vertical Magnetic Field Applied," 1987, pp. 58–63, Okochi Memorial Foundation, Japan.

Watanabe, M. et al., "Direct Observation And Numerical Simulation Of Molten Silicon Flow During Crystal Growth Under Magnetic Fields by X–Ray Radiography And Large–Scale Computation," 1999, pp. 215–238, vol. 38, No. 1–4, Progress In Crystal Growth and Characterization of Materials, Elsevier Publishing.

*Primary Examiner*—Felisa Hiteshew
(74) *Attorney, Agent, or Firm*—Squire, Sanders & Dempsey L.L.P.

(57) ABSTRACT

An apparatus and method is provided for manufacturing a semiconductor substrate such as web crystals. The apparatus includes a chamber and a growth hardware assembly housed within the chamber. A magnetic field system produces a vertical magnetic field within the chamber.

20 Claims, 12 Drawing Sheets

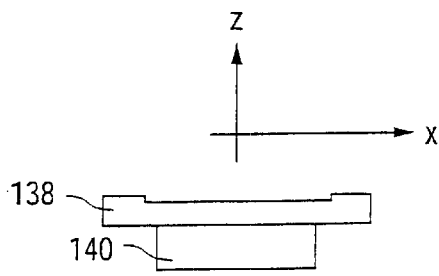
FIGURE 9A
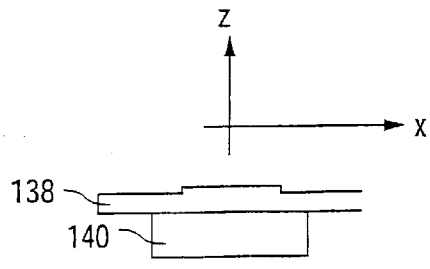
FIGURE 9B
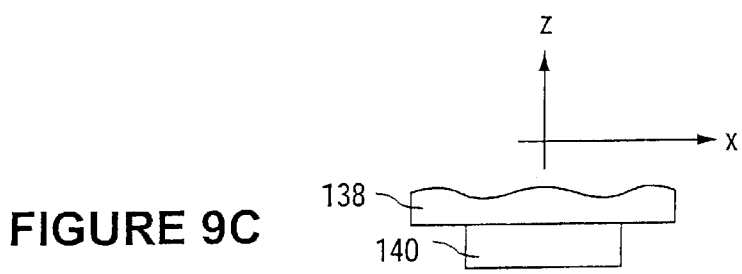
FIGURE 9C
FIGURE 15A
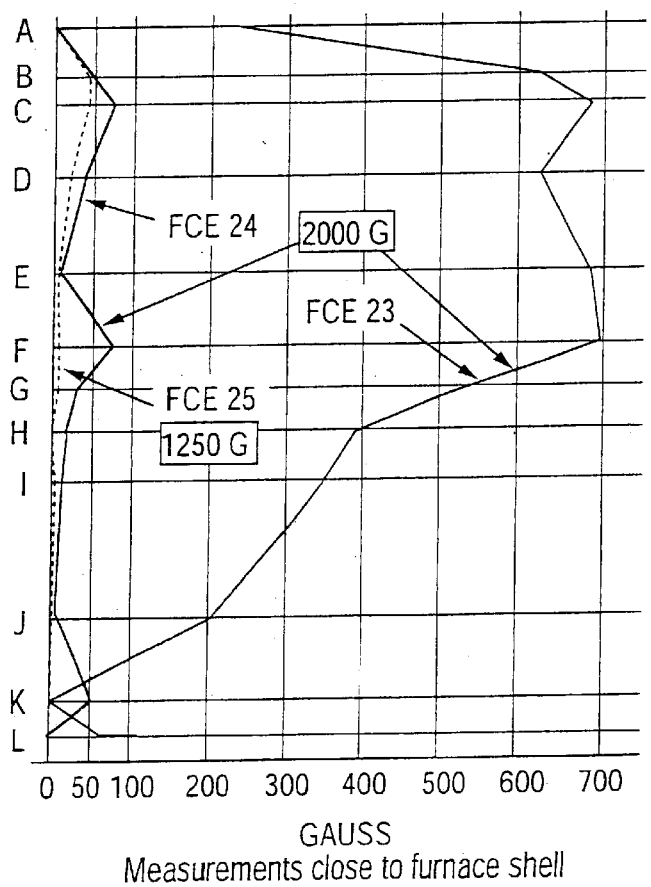

METHOD OF USING A MAGNETIC FIELD FURNACE TO MANUFACTURE SEMICONDUCTOR SUBSTRATES

RELATED APPLICATION

This application is a divisional of U.S. patent application Ser. No. 09/750,935 now U.S. Pat. No. 6482,261, titled "Magnetic Field Furnace and a Method of Using the Same to Manufacture Semiconductor Substrates," filed on Dec. 29, 2000, by inventors Hilton F. Glavish, Hideyuki Isozaki, Keiji Maishigi, and Kentaro Fujita and claims priority to it. The parent application is incorporated in its entirety in this application by this reference.

BACKGROUND OF THE INVENTION

The present invention relates to manufacturing semiconductor substrates, more particularly to a system and method for manufacturing crystals using a magnetic field furnace.

Dendritic web ribbon crystals are commonly used as substrates for solar cells because of their high chemical purity, low density of structural defects, rectangular shape, and relatively thin crystal size. Furthermore, solar cells fabricated from dendritic web silicon possess light energy to electrical energy conversion efficiencies as high as 17.3%, which is comparable to high efficiencies obtained using expensive processes such as Float Zone silicon and other well-known complex processes.

FIG. 1 illustrates a ribbon or sheet of a dendritic web silicon crystal 10. Dendritic web silicon crystal 10 is withdrawn as a single crystal from a first silicon melt region 12A. Second silicon melt regions 12B are separated from first melt region 12A by barriers 14. Barriers 14 are implemented to provide some measure of thermal isolation between first and second silicon melt regions 12A and 12B. Small openings (not illustrated) in barriers 14 allow molten silicon to flow from second melt regions 12B to first melt region 12A. By maintaining first melt region 12A just below silicon's melting point, crystal continually freezes in first melt region 12A. Second melt regions 12B become replenished by heating it just above the melting point and mechanically feeding silicon pellets into second melt regions 12B. First and second silicon melt regions 12A and 12B are contained in a crucible 16.

Silicon crystal 10 is typically grown by pulling a seed 18 at an upwardly direction at a speed of approximately 1.8 cm/min. The resulting dendritic web silicon crystal 10 includes a silicon web portion 20 bounded by silicon dendrites 22. Web portion 20 is typically about 3 to 8 cm in width and about 100 $\mu$m in thickness compared to the nominally square dendrites, which are typically about 550 $\mu$m thick. In order to sustain the above described crystal growth, the dendrite support structure is continually regenerated at pointed dendrite tips 24 beneath the surface of the melt contained in first melt region 12A.

The conventional dendritic web crystal growth processes suffer from several drawbacks such as "metastablility," which causes premature termination of crystal growth. Crystal lengths of only one or two meter can be achieved—which are commercially impractical to produce. To provide a commercially improved product, it was discovered that the application of a magnetic field to the melt, from which the crystal is drawn, produces improvements, including stabilization of dendritic web crystal growth. A patent application entitled "Method and System for Stabilizing Dendritic Web Crystal Growth," Ser. No. 09/294,529, filed on Apr. 19, 1999, assigned to the assignee of the present invention, and incorporated herein by reference, describes the application of a magnetic field to a dendritic web crystal growth. One example of such magnetic field is illustrated in FIG. 2. FIG. 2 illustrates a furnace chamber 30 having a dipole magnet which includes a pair of physically identifiable opposing poles 32A and 32B. A working gap G, located between poles 32A and 32B, is the location at which a growth hardware 34 for containing a crucible is positioned. Coils 36A and 36B are wrapped around poles 32A and 32B, respectively, for creating a horizontal magnetic field, i.e., generally along the X or Y-axis. External yoke 38 magnetically connects poles 32A and 32B.

What has now been discovered is that a multitude of advantages can be gained if a vertical magnetic field, i.e., generally along the Z-axis, is applied to growth hardware 34, as opposed to a horizontal field, i.e., generally along the X or Y-axis. To produce a vertical magnetic field, poles 32A and 32B must be positioned on top and bottom of chamber 30. This configuration, however, interferes with the production of dendritic web crystals. More specifically, the top pole serves as a physical barrier which prevents the extraction of the web through the top of chamber 30. Accordingly, there is a need for a magnetic generator which produces a generally vertical magnetic field without interfering with the production of web crystals.

SUMMARY

In accordance with one aspect of the embodiments of the present invention, an apparatus for manufacturing a semiconductor substrate such as web crystals is provided. The apparatus comprises a chamber and a growth hardware assembly located in the chamber. The growth hardware assembly is used for growing the substrate. A magnetic field generator encircles the perimeter of the chamber. The magnetic field generator is used for providing a magnetic field during the growth process. The chamber includes a vertical axis (illustrated as Z-axis) which can be generally defined by the longitudinal direction of crystal growth. The magnetic field generator produces a magnetic field that is generally in this vertical direction.

In one embodiment the magnetic field generator comprises a coil assembly which encircles the perimeter of the chamber. The coil assembly includes at least one winding element for receiving an electrical current. A cooling plate is in thermal communication with the coil assembly. The cooling plate is used for transferring heat generated from electrical current passing through the winding element. The heat can be removed by running water through cooling tubes disposed in the cooling plate. The cooling tubes can be electrically isolated from the winding elements for significantly reducing or eliminating electrolysis.

A shell can at least partially enclose the magnetic field generator. The shell can be used for containing the magnetic field within the shell, for controlling the direction of the magnetic field within the chamber, and enhancing the magnetic field strength at the location of the growth hardware assembly.

In one embodiment, the shell can include a sheath body having an upper flange extending from one end the sheath body and a base flange opposing the upper flange and enclosing the other end of the sheath body. The shell can be made from a ferromagnetic material and can additionally include a field clamp member disposed within the chamber and positioned over the growth hardware assembly. The field clamp member has an opening through which a web crystal can be extracted from the growth hardware assembly. The field clamp member is in magnetic communication with the upper flange, the upper flange being positioned outside of the chamber. A transition ring can be used to magnetically couple the upper flange to the field clamp member.

In accordance with another embodiment, a field shaping plate can be disposed in the chamber for supporting the growth hardware assembly. The field shaping plate can enhance the magnetic field over the growth hardware assembly. The field shaping plate can have a variable thickness to define a selected geometrical configuration, the magnetic field strength being dependent on the geometrical configuration.

In accordance with another aspect of the embodiments of the invention, a process for manufacturing dendritic web crystals is provided. The process includes the acts of providing a chamber having a growth hardware assembly—the growth hardware assembly containing a melt; growing a substrate from the melt; and applying a magnetic field to the melt during the act of growing, wherein said magnetic field is applied in the longitudinal direction of the growth within the chamber. The magnetic field generator circumscribes the perimeter of the chamber for applying the magnetic field to the melt.

BRIEF DESCRIPTION OF THE DRAWINGS

FIGS. 9A–C illustrate various alternative embodiments for a field shaping plate supported by a spacer for the magnetic shell;

FIG. 15A and 15B are graphs comparing the stray magnetic field of the system and furnace in according with one embodiment of the invention, with that of the dipole magnetic system of FIG. 2.

DETAILED DESCRIPTION OF THE EMBODIMENTS OF THE INVENTION

Apparatus

Figure 3:
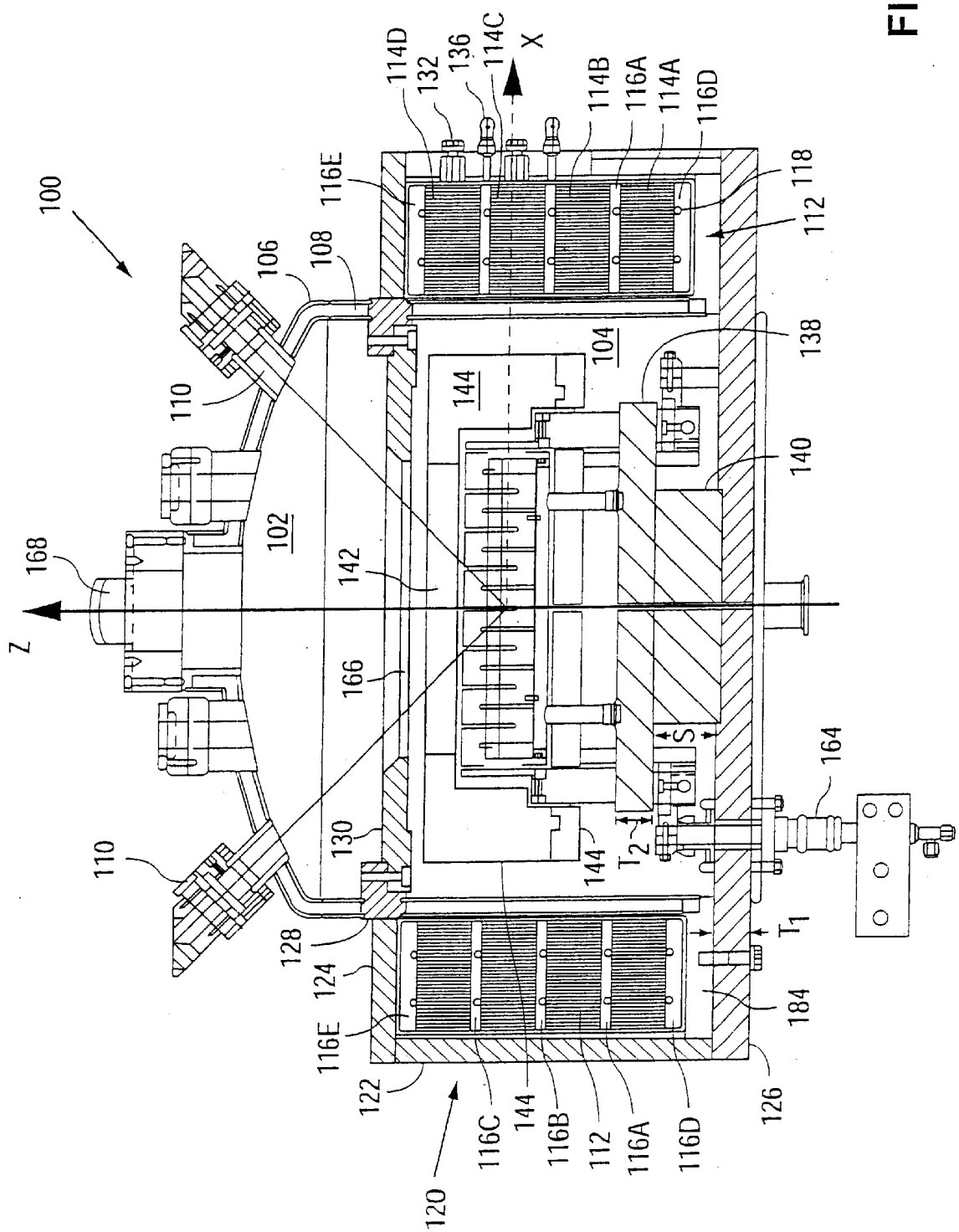
FIG. 3 is a side, sectional view of an embodiment of a furnace chamber having a magnetic field generator with a magnetic shell.
Figure 4:
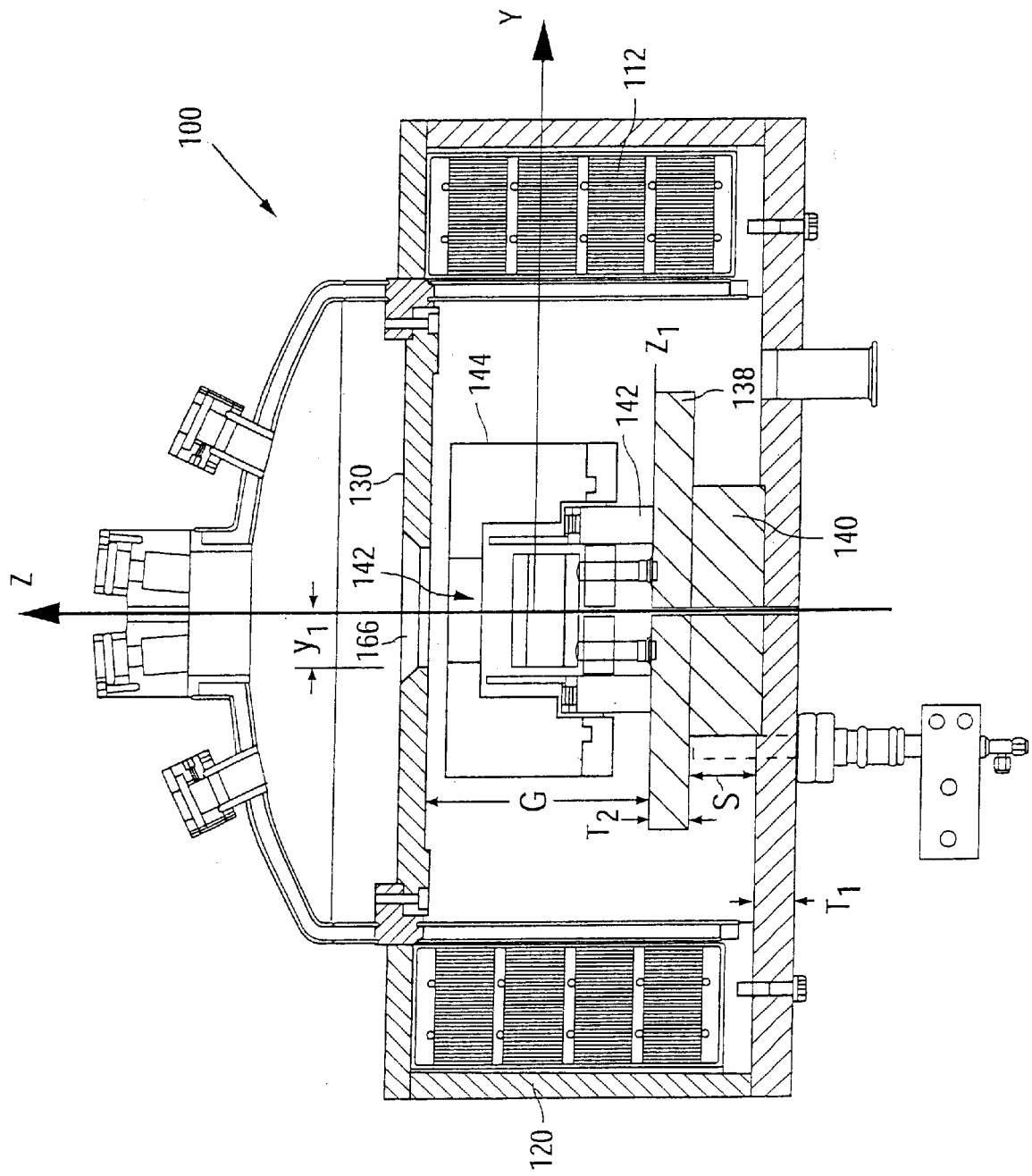
FIG. 4 is a side, sectional view of an embodiment of a furnace chamber having a magnetic field generator with a magnetic shell.

Referring now to the drawings, wherein identical parts are identified by identical reference numerals, FIGS. 3 and 4 illustrate a furnace chamber 100 used for manufacturing semiconductor substrates, such as single crystal or polycrystal type substrates. It is understood by one of ordinary skill in the art that the embodiments of the present invention can be used for the manufacturing of silicon sheet and ribbon growth, including string ribbon produced by Evergreen Solar and edge-defined film-fed growth (EFG) sheet produced by ASE Americas. For the purposes of the discussion, however, the embodiments of the present invention will be described in reference to the production of dendritic web crystals.

The structure of chamber 100 can be generally defined by an upper chamber cap 102 enclosing a lower cylindrical body 104. Chamber 100 can be generally bell-shaped and can include a double-wall structure 106 enclosing a gap 108 of, for example, about 5 mm to about 12 mm. By way of example, and not limitation, lower cylindrical body 104 can have a diameter of about 600 mm. Chamber 100 can have a variety of geometrical shapes, including elliptical, square, etc., and the geometrical shape should not be construed to be limited to what has been described or illustrated by the Figures. Gap 108 provides a means for removing heat and controlling the temperature of chamber 100 by circulating a cooling fluid, e.g., water, within gap 108. Non-ferromagnetic materials such as austenitic stainless steel can be used to manufacture chamber 100. View ports 110, provided on top of chamber 100, penetrate though double-wall 106 so as to allow an operator to monitor the dendritic web crystals during the manufacturing process. View ports 110 are illustrated to be oriented at approximately 45° to the Z-axis so as to give an operator a direct line of vision.

A cylindrically-shaped coil assembly 112, positioned outside double-wall 106, encircles lower cylindrical body 104, i.e., fitted like a ring around the cylindrical body 104. Coil assembly 112 is used to generate a magnetic field in a generally vertical direction within chamber 100. "Vertical" is defined as the direction generally parallel to the illustrated Z-axis. Alternatively, "vertical" is defined as the direction generally parallel to the longitudinal growth of the web crystals. Coil assembly 112 is illustrated to be approximately centered about the Z-axis, which has been drawn through the center of chamber 100; coil assembly 112, however, can be asymmetrical aligned with the Z-axis. One of ordinary skill in the art can appreciate that other geometrical configurations, such as elliptical or square can be employed for coil assembly 112.

In one useful commercial embodiment, coil assembly 112 can include four separate winding elements 114A, 114B, 114C, and 114D, electrically connected in series. Winding elements 114A–D can be, for example, made of 65 turns of copper strip, 1.245 mm×50.8 mm in dimension, and wound continuously with 0.08 mm thick inter-turn electrical insulation. Insulations such as mylar are suitable.

In one embodiment, three annular cooling plates 116A, 116B, and 116C can be disposed between each pair of adjacently positioned winding elements 114A–D. Cooling plates 116A–C can be made from any suitable material, such as aluminum, and can have any suitable thickness, for example, 10 mm. Thicker, stronger, and more robust cooling plates 116D and 116E made from, for example, 20 mm thick aluminum, can be employed to cap the top and bottom of winding elements 114A and 114D. Cooling plates 116A–E provide a means for removing or dissipating ohmic heat generated from the electric current passing through winding elements 114A–D. A cooling fluid such as water can be circulated through cooling plates 116A–E via cooling tubes 118, e.g., copper tubes inserted in cooling plates 116A–E. An important aspect of the described structural embodiment is the electrical isolation of cooling tubes 118 from winding elements 114A–D. In the case of water cooling, electrical isolation of cooling tubes 118 from winding elements 114A–D significantly eliminates electrolysis and the need for using de-ionized cooling water—which, in effect, minimizes operating cost and maintenance.

Figure 5:
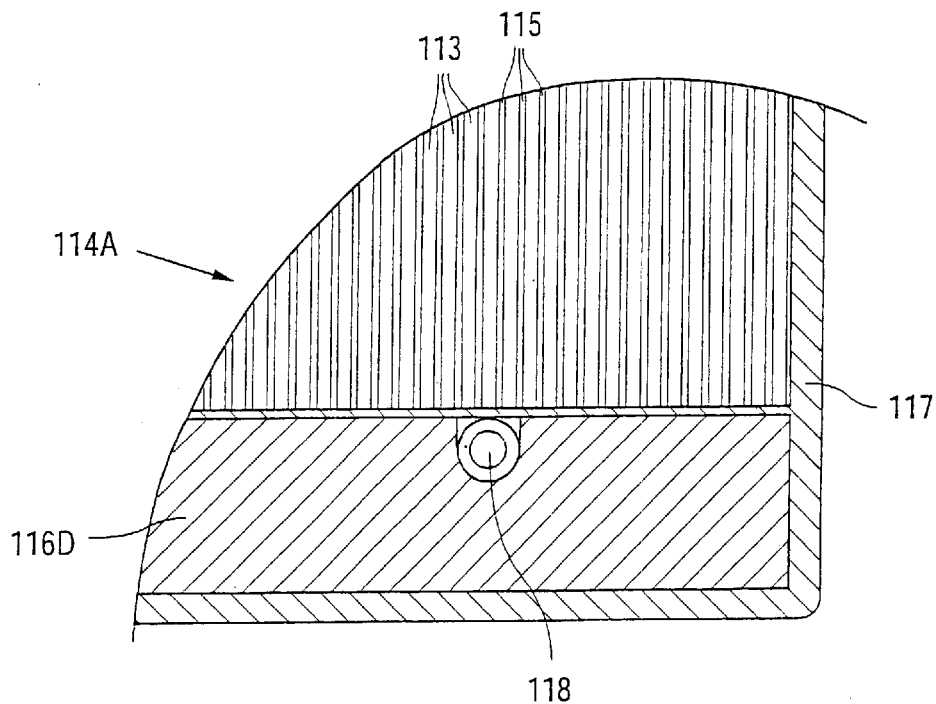
FIG. 5 is an enlarged view of a section of a winding element of the magnetic field generator capped by a cooling plate.

Referring to FIG. 5, an enlarged view of a section of winding element 114A is illustrated capped by cooling plate 116D. Cooling tube 118 is located in cooling plate 116D. Copper strips 113 can form winding element 114A and can include electrical insulation 115 such as mylar. In one embodiment, interleaved fiberglass cloth 117 can be used as one means for electrically isolating winding elements 114A–D from cooling plates 116A–E. The entire coil assembly 112 can also be wrapped with fiberglass tape, followed by vacuum impregnation with epoxy resin, to effectuate a single, rigid, impervious coil assembly 112. Coil assembly 112 should possess high integrity against stress generated from thermal expansion and contraction during operation. The resin impregnated fiberglass between the edges of the winding elements 114A–D and the adjacent surfaces of cooling plates 116A–E provide a high enough thermal conductivity for efficient transfer of heat.

The embodiments of coil assembly 112 should not be limited to the aforementioned description. One of ordinary skill in the art can appreciate a variety of implementations, including: any workable number of winding elements 114A–D and cooling plates 116A–E (for example two and three, respectively); other suitable materials used for winding elements 114A–D such as aluminum; and other suitable non-ferromagnetic materials used for cooling plates 116A–E, such austenitic stainless steel. Additionally, winding elements 114A–D can be made using rectangular, square, or solid copper or aluminum wire rather than thin strip. In an alternative embodiment, rectangular, square, or circular copper or aluminum tube can be used for the winding elements 114 which can be directly cooled by passing a deionized cooling fluid through the hole of the conductor tube, rather than using indirect cooling by thermal conduction to cooling plates 116A–E.

Interturn insulation can be implemented using other methods and materials, such as wrapping the conductor with an insulating tape, sliding an insulating sleeve over the conductor, or coating the conductor with an insulating film, e.g., enameled copper or anodized aluminum.

The above described structures apply to resistive coils wherein the conductor material has a non-zero electrical conductivity. It would also be possible to use a superconducting coil. However, while this would result in zero power dissipation in the coil, there would exist the complication and expense of maintaining the superconducting coil at very low temperatures, e.g., less than −260° C., for the case of present day superconducting materials.

In one embodiment a shell of soft ferromagnetic material (i.e., material that is easily magnetized such a low carbon steel), generally illustrated as 120, envelops lower cylindrical body 104 and coil assembly 112. Other suitable materials are disclosed in *Electronic Designers' Handbook*, $2^{nd}$ Ed. by L. J. Giacoletto (1977). The functions of ferromagnetic shell 120 include, but are not limited to, containing the magnetic field within shell 120 and thereby reducing the stray external magnetic field, controlling the direction of the magnetic field with chamber 100, and enhancing the magnetic field strength within a central region of chamber 100.

In one embodiment, shell 120 can be made of a number of components including a cylindrical sheath 122, an upper flange 124 extending from cylindrical sheath 122, and a base flange 126, opposing upper flange 124 and extending from cylindrical sheath 122.

Figure 6:
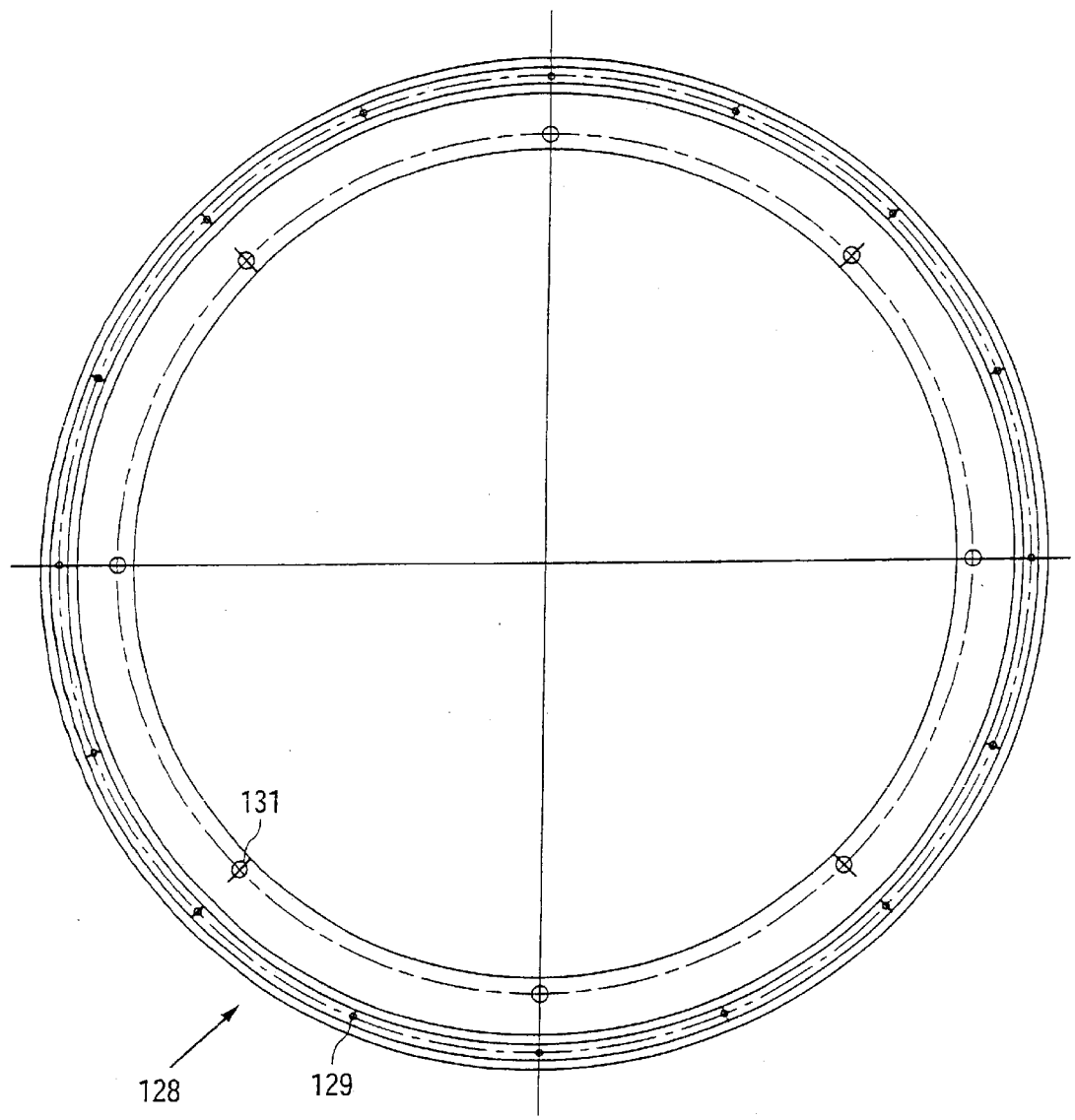
FIG. 6 is top plan view of an embodiment of a transition ring used with the furnace chamber.

A soft ferromagnetic transition ring 128 serves as a coupling medium for magnetically connecting upper flange 124, which is positioned on the outside of double-wall 106, to a soft ferromagnetic field clamp member 130, which is positioned inside of chamber 100. Transition ring 128 can be coupled between upper chamber cap 102 and lower cylindrical body 104. Transition ring 128, as illustrated in FIG. 6, includes apertures 129 formed about the circumference thereof for allowing the cooling fluid, e.g., water, to circulate about gap 108 from upper chamber cap 102 to lower cylindrical body 104. Transition ring 128 also includes fastening holes 131 for allowing transition ring 128 to be fastened to field clamp member 130.

The cooling fluid collects the heat generated by chamber 100. The cooling fluid also cools transition ring 128 and field clamp member 130 and maintains them at a low enough temperature (e.g., 50° C.–300° C.) to prevent degradation of their magnetic properties. Although more expensive than soft carbon steel, constructing transition ring 128 from martensitic magnetic stainless steel significantly inhibits detrimental corrosion from cooling water.

Figure 8:
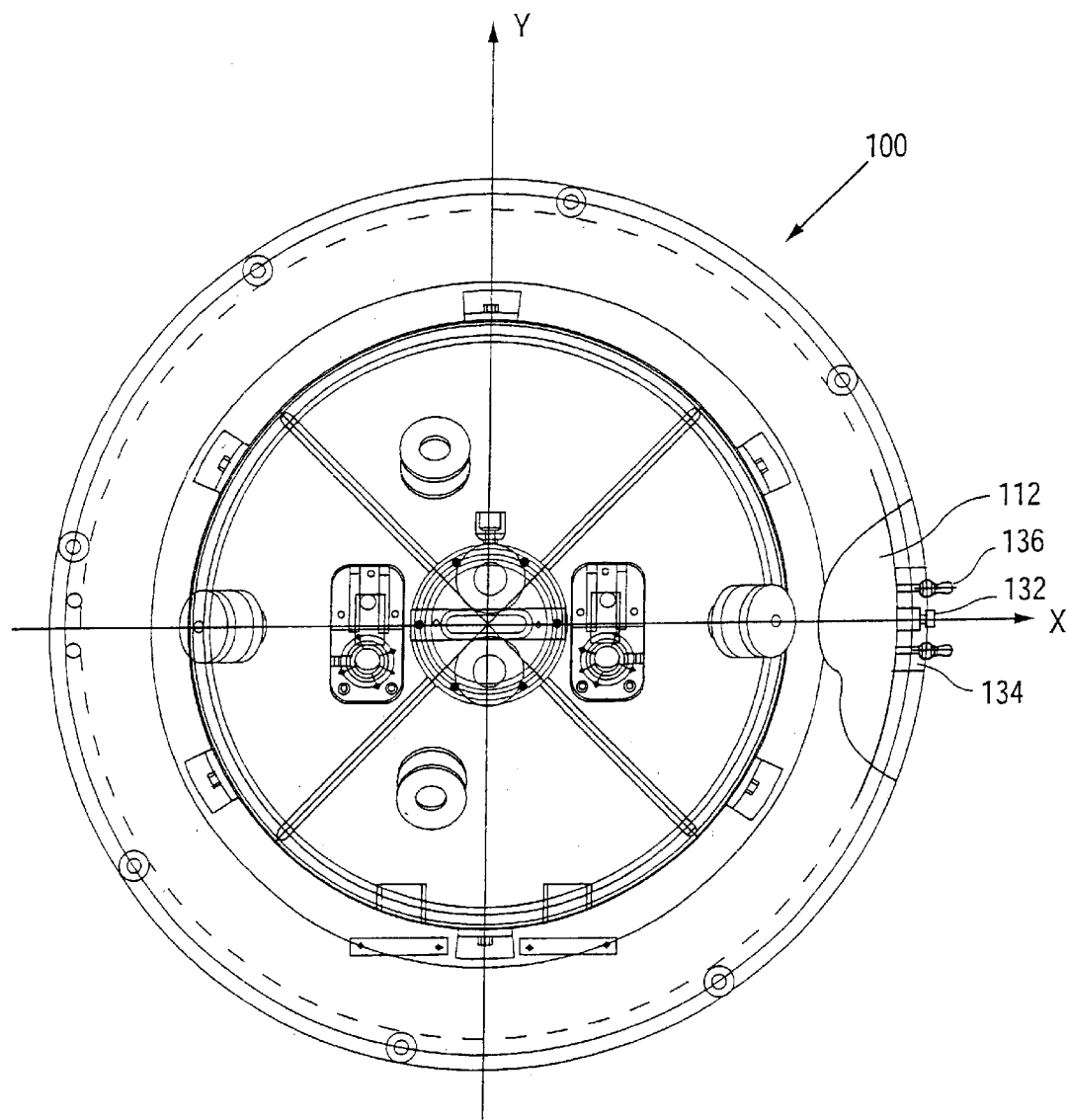
FIG. 8 is a top plan view of the furnace chamber with a partial cut away section.

Referring to FIGS. 3 and 8, threaded terminals 132, connected to the first and last turn of coil assembly 112, are accessible through a cut-out 134 in cylindrical sheath 122. Connections 136 to coil cooling plates 116A–E are also accessible through cutout 134. Stray field penetration through cutout 134 is negligibly small because the magnetic flux across cylindrical sheath 122 can split and pass down either side of cutout 134.

The orientation and physical arrangement of coil assembly 112 and ferromagnetic shell 120 produce a vertical magnetic field of sufficient strength (e.g., 500–3000 Gs) for stabilization of the crystal growth. Shell 120, including field clamp member 130, can be of relatively low mass (e.g., 350–450 Kg) but have sufficient thickness so as to not become fully magnetized or magnetically saturated by the generated magnetic flux at the maximum required magnetic field of at least 1500 Gs. Examples of suitable thickness $T_1$ (FIGS. 3 and 4) include about 8 mm to about 40 mm, more narrowly about 12 mm to about 25 mm. Shell 120, including field clamp member 130 can be constructed from any suitable soft ferromagnetic material such as low carbon steel.

Figure 1:
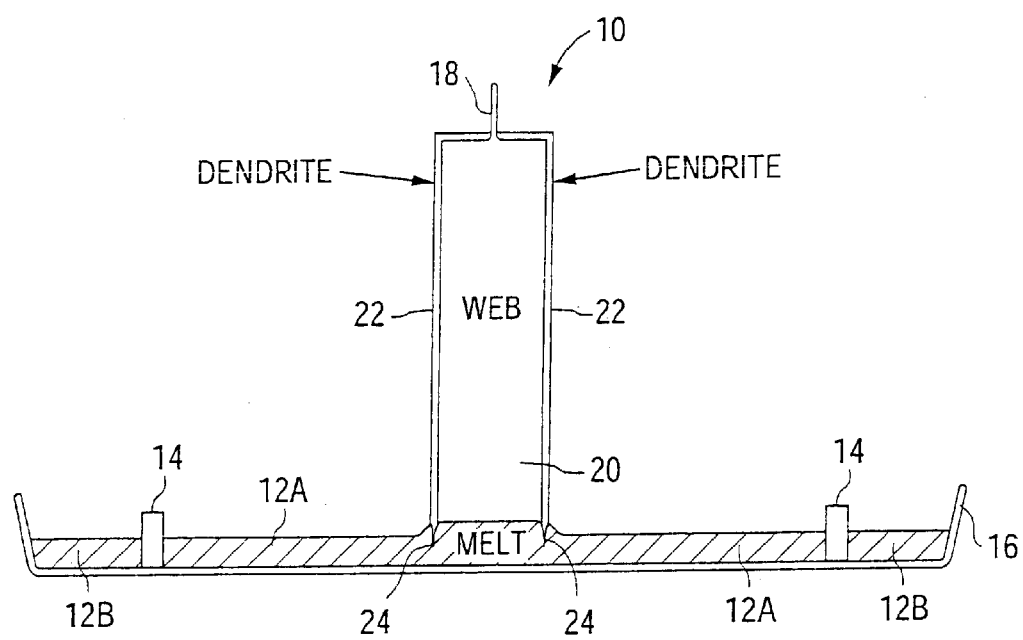
FIG. 1 is a schematic, cross-sectional view of a conventional crucible for growing a dendritic web crystal.

Referring to FIGS. 3 and 4, in another embodiment, magnetic shell 120 can additionally include a field shaping plate 138 supported by a spacer 140. Field shaping plate 138 supports a crystal growth hardware assembly 142, positioned generally at the center of chamber 100. Functions of field shaping plate 138 include, but are not limited to, enhancing the magnetic field over a silicon melt (12A of FIG. 1) and controlling the variation of the magnetic field strength along the silicon melt in the X direction. Field shaping plate 138 and spacer 140 can also be made from a soft ferromagnetic material such as carbon steel. Field shaping plate 138 can have an exemplary thickness T₂ of about 25 mm to about 40 mm. Spacer 140 provides a space S of about 30 mm to about 100 mm, more narrowly about 50 mm to about 70 mm from the top surface of base flange 126 to the bottom surface of field shaping plate 138. Functions of spacer 140 include, but are not limited to, efficient magnetic coupling of field shaping plate 138 to base flange 126, providing space underneath field shaping plate 138 for heater filaments hardware and providing a large vertical space within shell 120 in which to fit coil assembly 112 and thereby reduce required coil power.

As illustrated by FIGS. 9A, 9B, and 9C, field shaping plate 138 can have a variable thickness so as to create non-planar upper surface. Referring to FIG. 9A, field shaping plate 138 has a middle region which is thinner than the outer regions. Such a construction enhances the magnetic field at each end of the silicon melt relative to the field at the center of the melt. Alternatively, as illustrated in FIG. 9B, with the middle region having a greater thickness than the outer regions, the magnetic field at the ends of the silicon melt is reduced relative to the field at the center. In accordance yet with another embodiment, as illustrated in FIG. 9C, field shaping plate 138 can have a contoured surface for selectively varying the magnetic field over the silicon melt.

Ferromagnetic shell 120, including field clamp member 130, field shaping plate 138 and spacer 140 produce a magnetic field strength of about 500 Gs to about 3000 Gs which corresponds to power dissipation of about 170 Watts to about 6300 Watts in the coils.

As best illustrated by FIG. 3, hardware assembly 142 can be partially enclosed by a thermal insulator, such as graphite elements 144. By enclosing the bottom and the sides of hardware assembly 142, graphite elements 144 provide thermal insulation for minimizing the power required to maintain a crucible element 146 (see FIG. 10) at the required operating temperature (e.g., about 1400° C.).

A patent application entitled "Method and System for Stabilizing Dendritic Web Crystal Growth," Ser. No. 09/294, 529, filed on Apr. 19, 1999, assigned to the assignee of the present invention, and incorporated herein by reference, describes crucible element 146. Briefly, referring to FIG. 10 and 11, crucible element 146 includes a first melt region 148A surrounded by second melt regions 148B. First melt region 148A is separated from second melt regions 148B by barriers 150. Small openings (not illustrated) in barriers 150 allow the molten composition, e.g., silicon, to flow from second melt regions 148B into first melt region 148A. By maintaining first melt region 148A just below the silicon crystal's melting point (1412° C.), crystal continually freezes from first melt region 148A. First melt region 148A becomes replenished by heating second melt regions 148B above the crystal's melting point and mechanically feeding silicon pellets into second melt regions 148B through feed holes 152. A lid 154, e.g., a molybdenum (Mo) lid, and shields 156 cover crucible element 146. An aperture (number omitted) is disposed in lid 154 and shields 156 to allow the drawing of a dendritic web crystal 158 from hardware assembly 142. Shields 156, serving to reduce heat loss from lid 154, create a vertical temperature profile on dendritic web crystal 158 for cooling dendritic web crystal 158 with minimum thermal stress. Resistance heaters 160 can surround and impart sufficient thermal energy through a susceptor 162 to maintain the component of hardware assembly 142 and the growing dendritic web crystal 158 at the appropriate temperature during crystal growth. Referring back to FIG. 3, electrical power passes to the resistance heaters 160 via feed-through coupling 164 in base flange 126.

Figure 7:
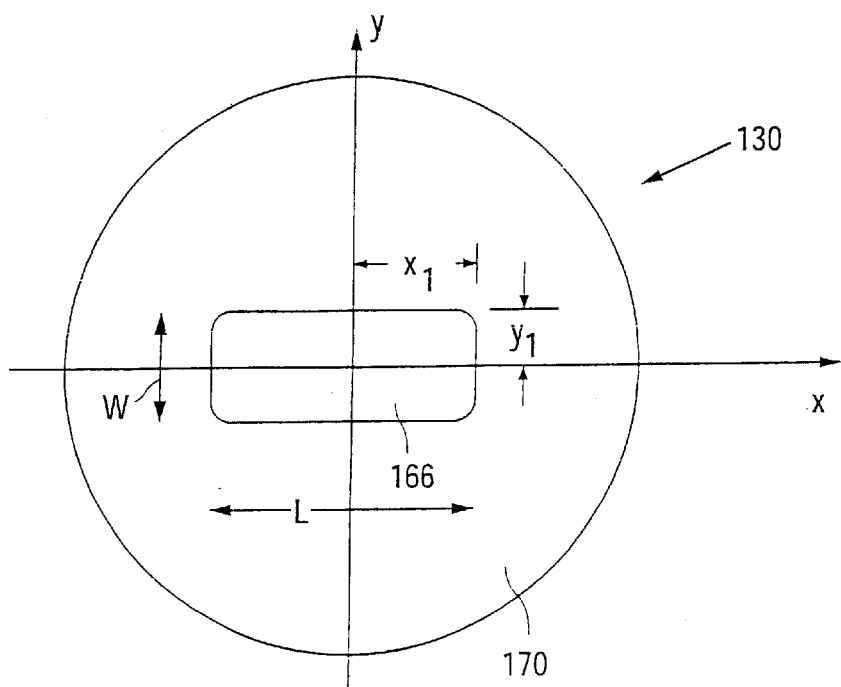
FIG. 7 is a top plan view of one embodiment of a field clamp member having an opening for allowing the web to be extracted out from the furnace chamber.
Figure 10:
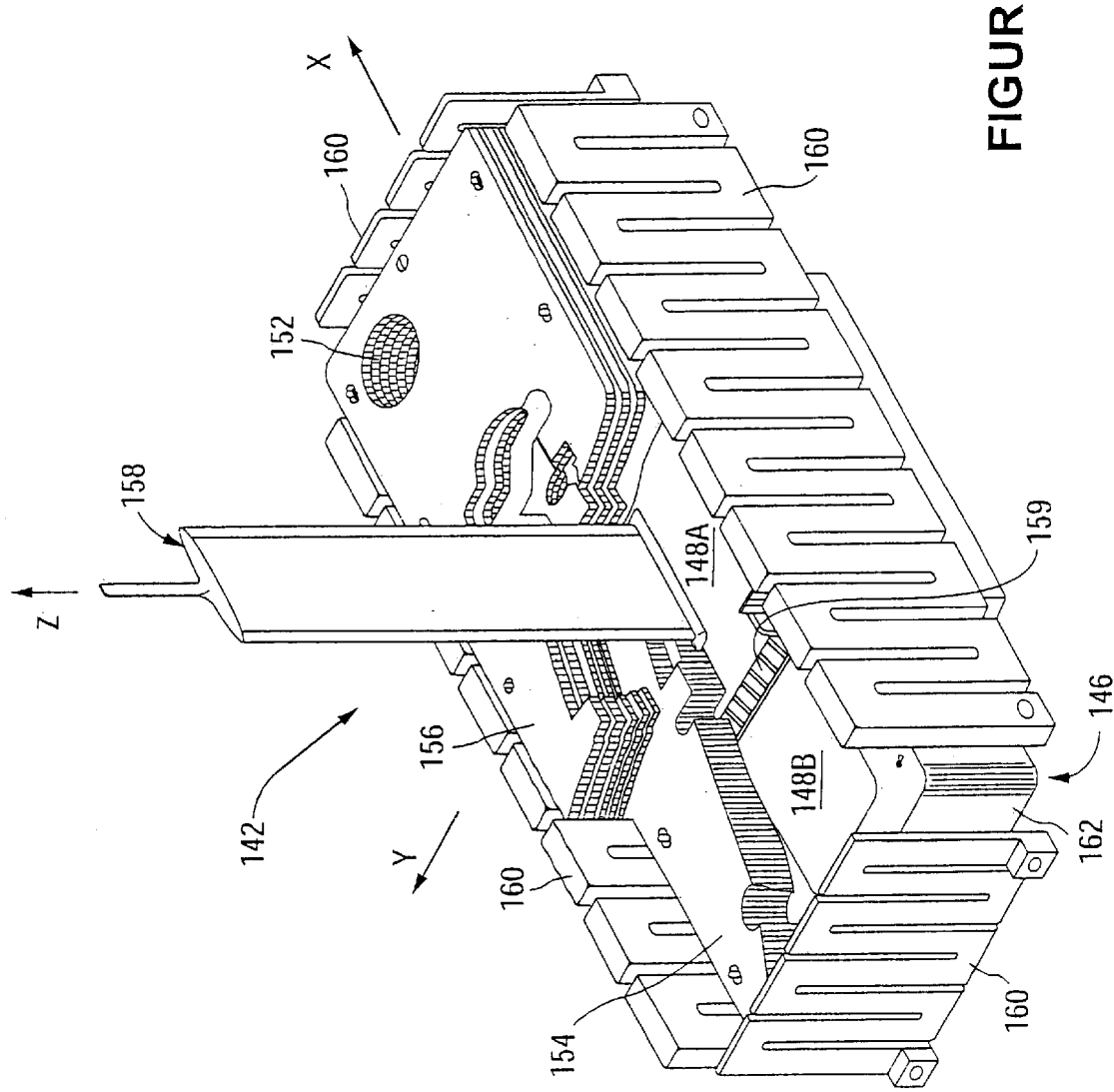
FIG. 10 is a cut-away perspective view of a conventional growth hardware assembly, used to manufacture dendritic web crystals.
Figure 11:
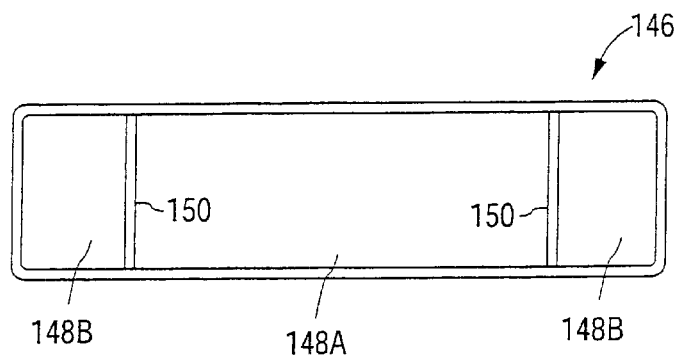
FIG. 11 is a schematic, top plan view of a crucible for the growth hardware assembly of FIG. 10.

As best illustrated in FIGS. 3 and 4, dendritic web crystal 158 is mechanically pulled out or extracted from the top of furnace chamber 100, along the Z-axis, through an opening 166 in field clamp member 130 and an opening port 168 of furnace chamber 100. FIG. 7 is atop plan view of the field clamp member 130 having a circular body 170 with rectangular opening 166. Rectangular opening 166 is illustrated to have length L along the X axis and width W along the Y-axis. Length L and width W can be any of any suitable dimension and preferably W should be as small as possible to reduce the magnetic field penetration through opening 166, and to maintain the most enhanced magnetic field at the silicon melt. By way of example, length L can be from about 150 mm to about 350 mm, more narrowly from about 250 mm to about 300. A suitable length should also allow for a direct line of vision to the dendritic web crystal formation. By way of example, width W can from about 50 mm to about 180 mm, more narrowly from about 80 mm to about 120 mm. Dendritic web crystal 158, as illustrated in FIG. 10, has a width along the X-axis, length along the Z-axis, and thickness along the Y-axis.

One of ordinary skill in the art can appreciate various other embodiments that can be implemented with the present invention. For example, coil assembly 112 requires only a modest coil power and possesses excellent magnetic self-shielding. Consequently, rectangular opening 166 of field clamp member 130 can be made larger in the Y-direction without a consequential rapid increase in the geometrical mmf factor k or coil power, or the external stray magnetic field. Opening 166 of field clamp member 130 may also assume other shapes such as elliptical, circular, etc. Such other embodiments may be advantageous for controlling the vertical temperature profile the dendritic web crystal.

Vertical Magnetic Field

Figure 2:
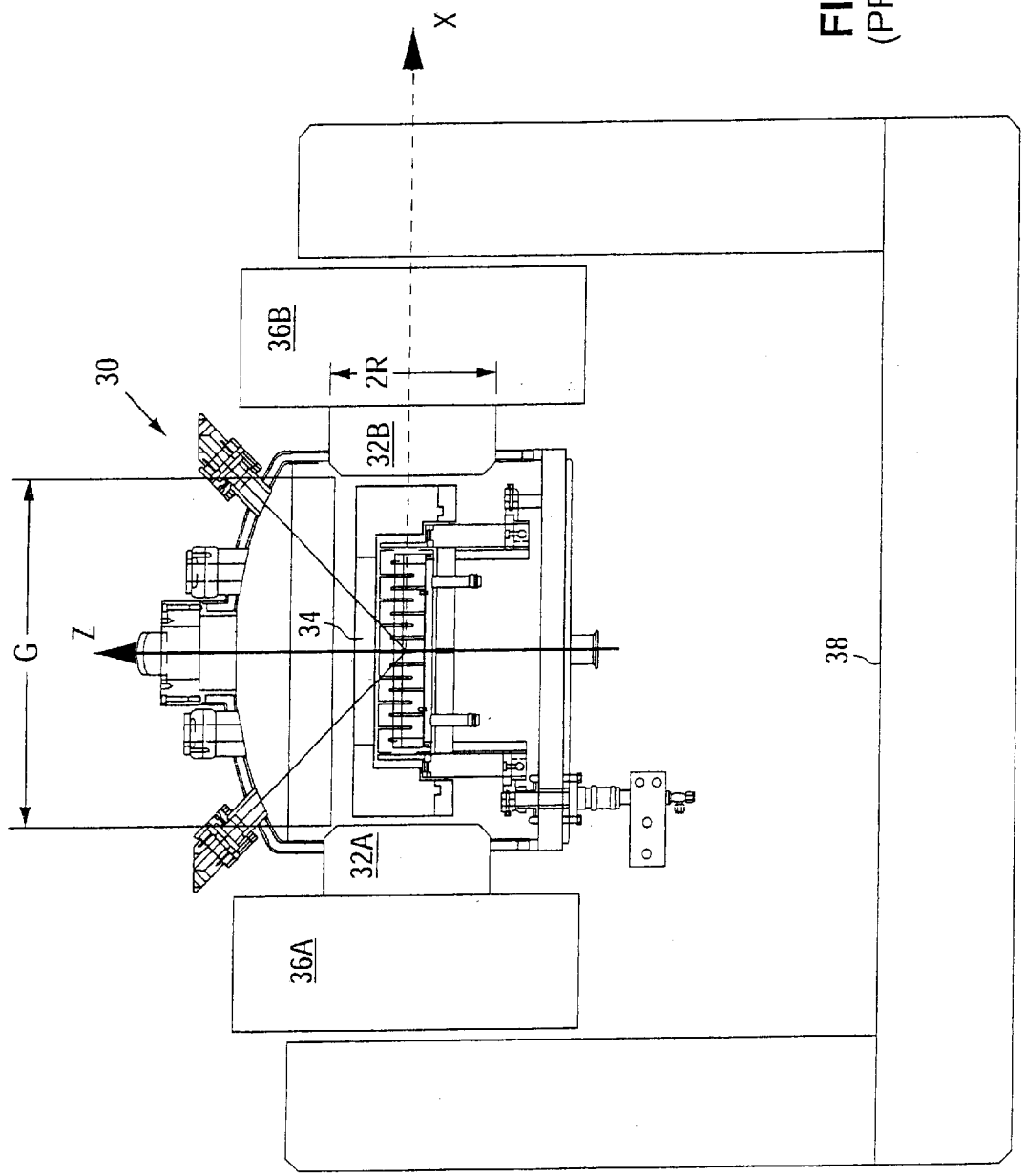
FIG. 2 is a schematic, sectional view of a conventional furnace chamber used to produce a substrate, the chamber includes a dipole magnet for applying a horizontal magnetic field to a crucible.

The orientation and physical arrangement of coil assembly 112 and magnetic shell 120 produce a magnetic field in the vertical direction for stabilizing crystal growth. Other benefits have been observed to include, but are not limited to, reduction of power and coil volume required to obtain equivalent beneficial results in the production of the product, longer average crystal lengths, and reduction in erosion of the components of chamber 100, including growth hardware 142 and quartz crucible 146 of FIG. 11, which contains the molten silicon. The magnetic system configuration of the embodiment of the present invention is quite different from the conventional dipole magnet system. The conventional dipole magnet, as illustrated in FIG. 2, generates a horizontal field in the X or Y direction. The conventional dipole magnet has a pair of physically identifiable poles 32A and 32B and coils 36A and 36B wrapped around each pole 32A and 32B, respectively. Working gap G, which is the space between poles 32A and 32B contains a growth hardware 34. An external yoke 38 magnetically connects poles 32A and 32B.

It is very difficult to use such a conventional dipole to generate a vertical (Z-direction) field. When oriented in this way, i.e., one pole located at the top of chamber 30 and the other on the bottom of chamber 30, the upper pole and coil would interfere with the web extraction through the top of chamber 30. Simply put, the upper pole and coil would provide a physical obstacle on top of chamber 30, making it difficult to withdraw the web.

With the magnetic system of the embodiments of the present invention, only a single coil assembly 112 is employed surrounding chamber 100. Thus, the use of a distinct pair of opposing poles is eliminated. At most there is a vestigial pole formed by spacer 140 and field shaping plate 138. A vertical magnetic field along the Z-axis is created without the necessity of positioning a pole on top of chamber 100, and with a suitably large aperture 166 to withdraw the web and monitor its formation without any visual obstructions.

Figure 12:
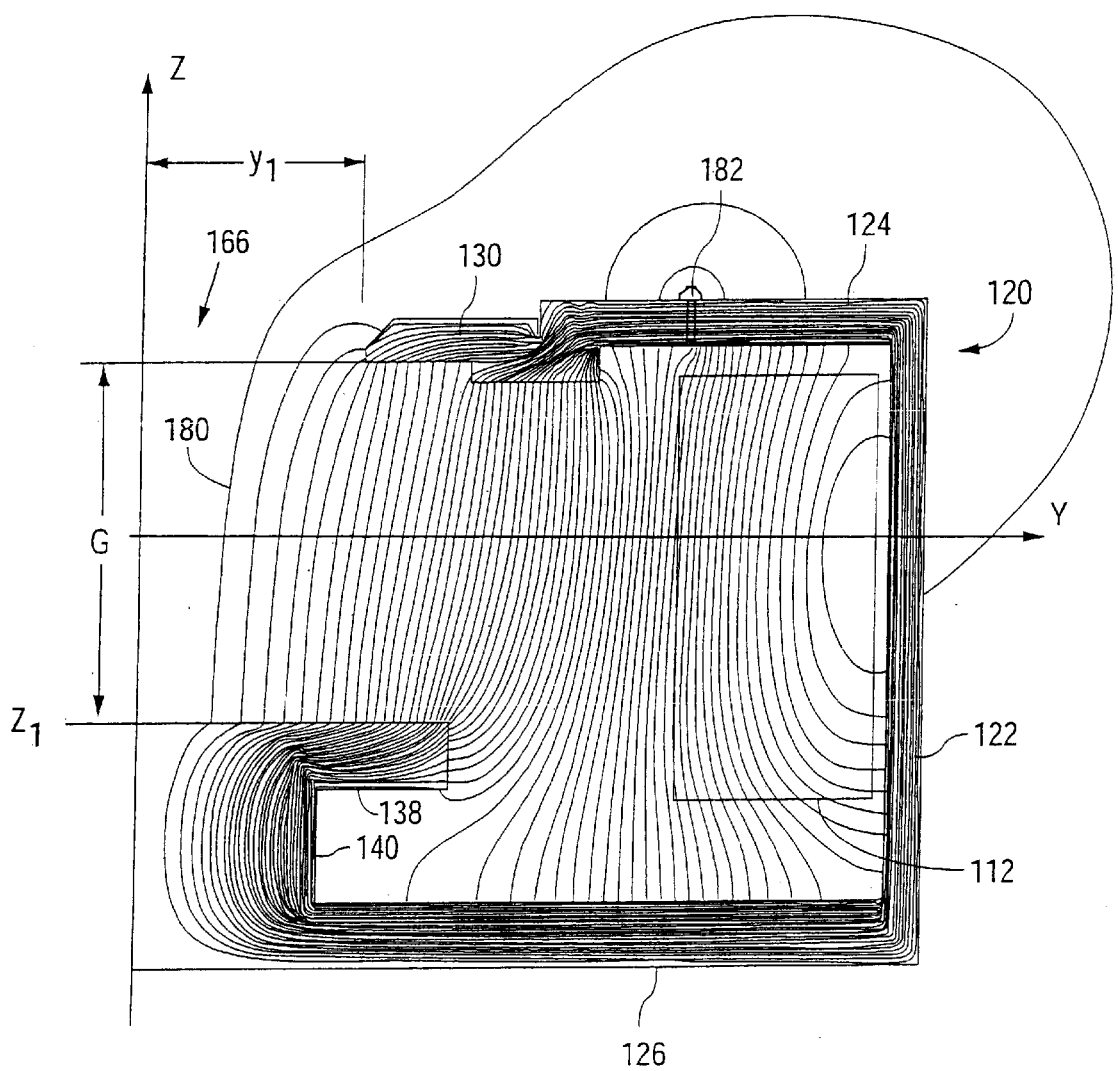
FIG. 12 is a plot of the magnetic flux tubes obtained from calculations of the magnetic system for the furnace chamber of FIGS. 3 and 4.

Referring to FIGS. 4 and 12, the coil amp-turns J or magnetomotive force (mmf) needed to drive the magnetic flux from the upper surface (at $z=z_1$) of the field shaping plate 138, across the working gap G containing growth hardware assembly 142, to the lower edge (at $y=y_1$) of opening 166 of field clamp member 130, is now calculated. According to Ampere's law [J. C. Slater and N. H. Frank, Electromagnetism, McGraw-Hill, 1947, pp. 59–62]:

$$J \approx \frac{1}{\mu_0}\left\{\int_{z_1}^{G+z_1} B_z(0,0,z)\,dz + \int_0^{y_1} B_y(0,y,G+z_1)\,dy\right\} \tag{1}$$

The magnetic force required to drive the magnetic flux through ferromagnetic shell 120 is negligibly small compared with the magnetomotive force J given by equation (1) for driving the magnetic flux across the working gap, provided the thickness of ferromagnetic shell 120 is sufficient to prevent the shell from becoming fully magnetized, i.e., magnetically saturated.

Since the magnetic field B in the working gap is generally along the Z-direction, the magnetic flux Φ is given approximately by the integral of $B_z$ over the area of field clamp 130 and upper flange 124. In other words $$\Phi \approx \{\int\int B_z(x,y,G+z_1)\,dx\,dy\} \tag{2}$$

$$?\Pi/4 B_0 D_c^2$$

where $B_0$ is the z component of the magnetic field at the web-melt interface (i.e., at z=0) and $D_c$ is the mean diameter of coil assembly 112. If $D_s$ is the mean diameter of sheath 122 and $B_s$ is the limiting flux density in sheath 122, to avoid magnetic saturation, the minimum thickness of sheath 122 is $$T_{min} ? \Phi/\Pi D_s B_s ? B_0 D_c^2 / 4 B_s D_s \tag{3}$$

Exemplary values for the furnace and magnetic generator shown in FIG. 3 are $B_0$=3 kG $D_c$=668 mm $D_s$=835 mm $B_s$=18 kG Giving a minimum sheath 122 thickness $T_{min}$ of 22.3 mm.

Upper flange 124, base flange 126, and field clamp member 130 should also have this minimum thickness near their outer perimeters to avoid magnetic saturation.

Referring to FIG. 7, it is of practical importance to make field clamp opening 166 longer in the X-direction than in the Y-direction in order for the furnace operator to monitor the crystal formation and growth by video camera. It should be noted that, $y_1$ is made small in order to minimize the second term in Equation (1) and hence the mmf. A second reason for keeping $y_1$ small is to minimize the magnetic field penetration through the aperture and out into the external operator environment.

A clearer understanding of Equation (1) follows if it is written in the following form $$J = \frac{1}{\mu_0} k B_0 G \tag{4}$$

where k is a geometrical mmf factor dependent on the detailed structure of shell 120 and to a lesser extent on that of the coil. Comparing Equation (1) with Equation (1) it follows that $$k = \frac{1}{B_0 G}\left\{\int_{z_1}^{G+z_1} B_z(0,0,z)\,dz + \int_0^{y_1} B_y(0,y,G+z_1)\,dy\right\} \tag{5}$$

The significance of k now becomes apparent. In an ideal case when $y_1$=0 and the field is perfectly uniform ($B_z=B_0$), the second term in the expression for k vanishes and the first term is unity. It follows that $$k \geq 1 \tag{6}$$

and the closer k is to unity the more ideal is the structure from the point of view of minimizing the mmf as given by Equation (4).

Figure 13:
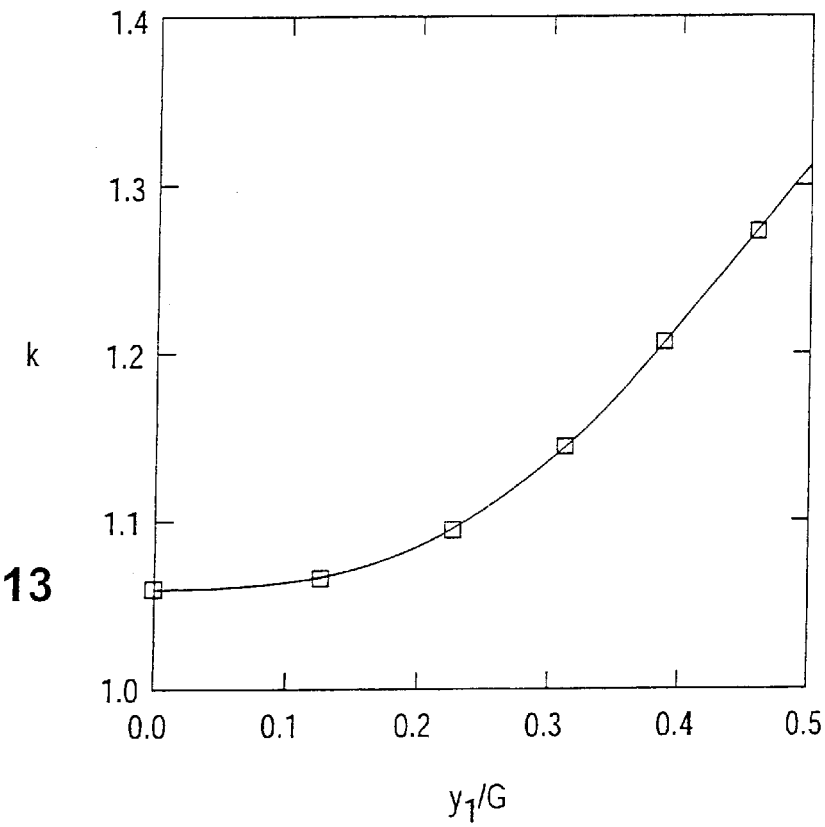
FIG. 13 is a graph of the variation of the geometrical mmf factor with the width of the narrow dimension of the opening in the field clamp member relative to the working gap, according to an embodiment of the present invention.

The value of k can be calculated theoretically using a code such as POISSON/SUPERFISH, LA-UR-87-115, 1987 Los Alamos National Laboratory, Los Alamos, NM 87545. FIG. 12 shows the result of such a calculation for the embodiment of FIGS. 3 and 4. The contour lines 180 represent equal incremental tubes of magnetic flux. The value of k versus $y_1/G$ is plotted in FIG. 13. For $y_1$=56 mm and G=200 mm, as shown in FIG. 4, we obtain $$k=1.12 \tag{7}$$

Figure 14:
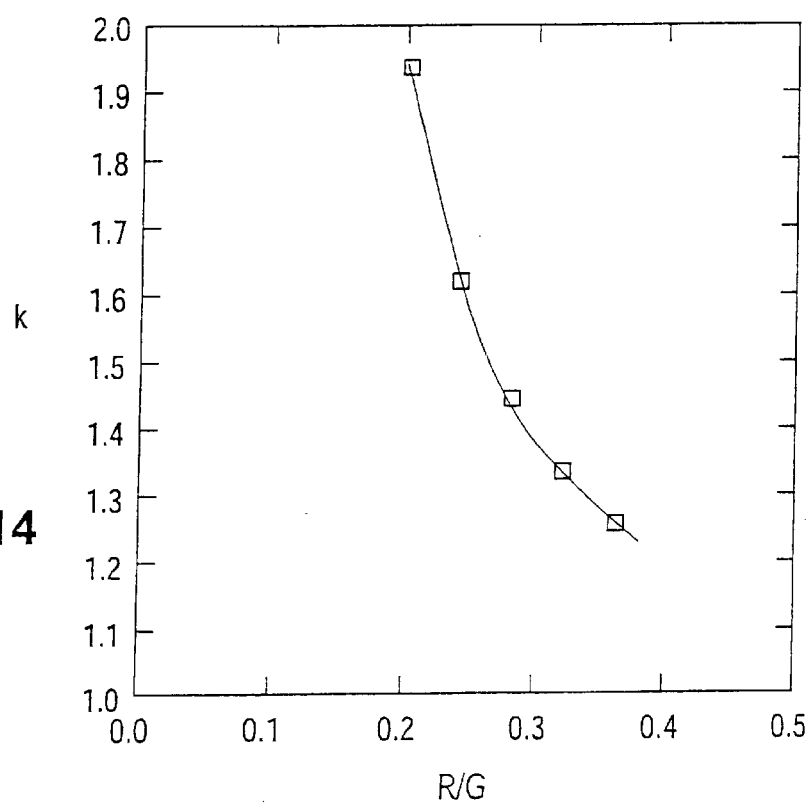
FIG. 14 is a graph of the variation of the geometrical mmf factor with the pole radius relative to the working gap for the dipole system illustrated in FIG. 2.

For a conventional dipole of the type shown in FIG. 2 the value of k versus R/G, where R is the pole radius, is much higher as shown in FIG. 14. For example, with the furnace shown in FIG. 3, G=500 mm and $$k=1.57 \tag{8}$$

for a pole tip radius of R=125 mm.

Figure 15B:
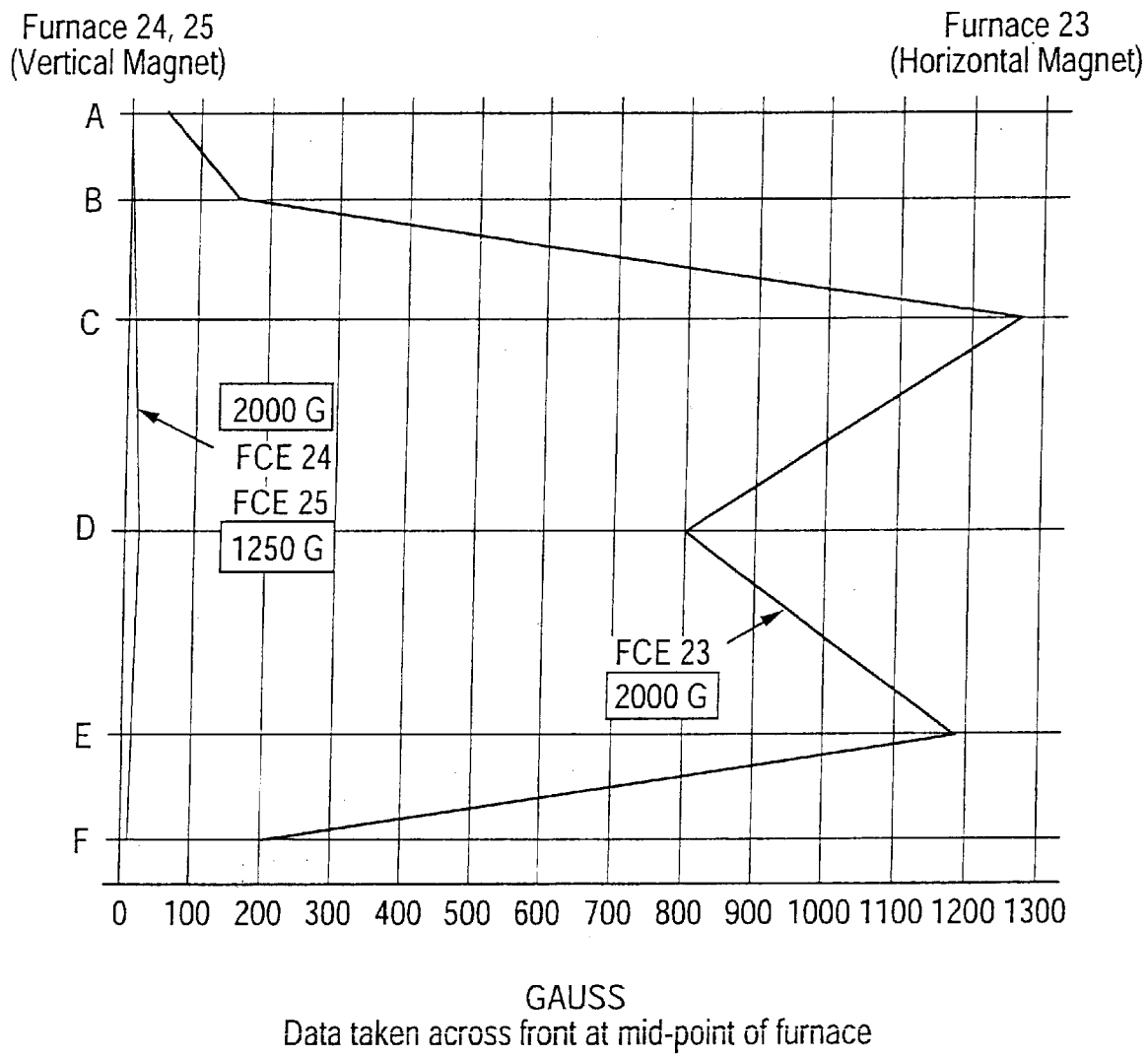

It is seen from FIG. 12 that the shell 120 enclosing coil assembly 112 effectively contains the magnetic field. The only significant field penetration is from opening 166 in field clamp member 130. Minor penetration can occur in other apertures that may be present in the system, for example aperture 182, as a result of construction or assembly of the system. As shown in FIGS. 15A and 15B, the embodiments of the present invention can reduce the stray magnetic field by a factor of 10 to 100, as compared with a horizontal field magnet applied to the same furnace. In FIG. 15A, vertical axis denoted by letters A through L are the physical locations along the Z axis in the chamber 100—beginning at the top of chamber 100 and finishing at the floor level. In FIG. 15B, A through F are lateral locations, i.e., along the X axis, at z=0 across the front of chamber 100.

Achieving a low coil power dissipation is important in a commercial system as this directly impacts both the operating and capital cost of a production factory. In the case of a cylindrical coil of mean turn length L and copper cross-sectional area A the power dissipation P is $$P = \frac{J^2 L}{\sigma A} = \frac{k^2 B_0^2 G^2 L}{\sigma \mu_0^2 A} \tag{9}$$

where σ is the electrical conductivity of the coil winding material. From the standpoint of capital cost, the volume V of the coil conductor is also important:

$$V = LA \quad (10)$$

The Table below shows that a coil power of 2.8 kW and a copper volume of 0.038 m³ produces a field of 2000 Gauss at the silicon melt in the case of the vertical field magnet. This is only 40% of the power and 60% of the copper volume needed to achieve the same field with a conventional, horizontal field, dipole magnet. The mass M of the vertical field magnet is also significantly less.

| Parameter | Vertical Field Magnet | Horizontal Field Magnet |
|---|---|---|
| Coil Conductor | Copper | Copper |
| $B_0$ (Gauss) | 2,000 | 2,000 |
| G (mm) | 200 | 500 |
| k | 1.12 | 1.57 |
| L (mm) | 2,100 | 1,225 |
| A (mm²) | 18,080 | 51,600 |
| V (m³) | 0.038 | 0.063 |
| M (kg) | 890 | 2490 |
| P (kW) | 2.80 | 7.04 |

Other significant commercial advantages related to crystal growth can be realized with the multitude of embodiments of the present invention. For example, with the same growth hardware, a field of 1500 Gauss stabilizes crystal growth compared for example with 2000 Gauss for the conventional arrangement illustrated in FIG. 2. Referring to Equation (9), operation at this lower stabilizing field reduces the coil power from 2.80 kW to 1.58 kW, i.e., by 43%.

As another exemplary advantage, longer average crystal lengths have been produced. For example lengths about 9.4 m have been manufactured, well above the 4.5 m present-day commercial viability.

As yet another exemplary advantage, a reduction in quartz crucible erosion rate of about 50% can be obtained. Illustratively, a 2 mm crucible wall thickness provided 18 day runs compared with 9 day runs for a system employing the arrangement of FIG. 2.

The working volume $V_w$ in furnace chamber 100 can be made larger or smaller by spatially scaling chamber 100 dimensions by a factor S, in which case $$V_w \propto S^3 \quad (1)$$

According to Equation (9) the coil power factor $P\sigma/B^2$ scales as S, i.e., $$P\sigma/B^2 \propto S \propto V_w^{1/3} \quad (12)$$

According to Equation (3) it follows that to avoid saturation, ferromagnetic shell 120 mass must vary as $S^3$ Coil assembly 112 mass will also vary as $S^3$ and hence the magnetic generator mass M as a whole varies as $S^3$, i.e., $$M \propto S^3 \propto V_w \quad (13)$$

Taking account of the above scaling relationships, a scale independent figure of merit $\eta_m$ for multitude of embodiments of the present invention is $$f_m = B^2 V_w^{4/3}/PM\sigma \quad (14)$$

If refrigerated cooling is used to lower σ, the power P should include the power consumed by the refrigerator as well as the ohmic power dissipated in the windings.

Coil power P and magnetic generator mass M are in effect measures of operating cost and capital cost, respectively. As these decrease for a given magnetic field B, figure of merit $f_m$ correspondingly increases.

Referring to FIG. 3, lower cylindrical body 104 encloses a cylindrical working volume $V_w$ of exemplary dimensions of 585 mm diameter by 300 mm in height, giving a value $$V_w = 0.7854 \times 300 \times 585^2 = 8.0635 \times 10^7 \text{ mm}^3$$

Using $$\sigma = 5.8 \times 10^4 \text{ mm/ohm}$$

for the copper winding conductivity and B=2,000 Gs, P=2,800 W, M=890 kg as given in the table above, Equation (15) gives a figure of merit $$f_m = 0.964 \text{ Ohm } Gs^2 \text{ mm}^3/\text{kg } W$$

By comparison, the conventional horizontal magnet described in the table has a figure of merit $f_m = 0.137$, over a factor of 6 less than that of the vertical field magnet. With the practice of the present invention, figure of merit $f_m$ of greater than about 0.5 can be achieved.

It is important to have fast, convenient access to the interior parts of furnace chamber 100 to replace an eroded crucible, remove silicon deposits and maintain the interior furnace hardware. Referring to FIG. 3, access to growth hardware assembly 142 is obtained by elevating chamber 100, coil assembly 112, and shell 120 parts 122, 124, and 126 as an integral sub-assembly using a mechanical apparatus such as screw lift or winch. Following elevation, a 90-degree rotation about the X or Y axis provides convenient access into chamber 100 for cleaning and maintenance. Referring to FIG. 3, a base flange 184, made of any suitable material, such as stainless steel, is welded to the base of chamber 100 and facilitates the making of an integral sub-assembly of the parts to be elevated. Coil assembly 112 can be fastened to base flange 184 with, for example, six M12 bolts screwing into lower cooling plate 116D. Mechanical apparatus for elevating and rotating the integral assembly can be fastened with bolts to sheath 120 and base flange 184. There is a small clearance of approximately 1 mm between the outer surface of transition ring 128 and the inner surface of upper flange 124. This clearance facilitates assembly of the furnace and magnet components. Such a small gap does not significantly increase the required mmf or the coil power, or the external stray magnetic field.

Operation and Use

The operation of furnace chamber 100 in conjunction with coil assembly 112 to produce dendritic web crystals will be illustrated by the following example. The example should not be construed to limit the scope of the embodiments of the invention. Quartz crucible 16 (FIG. 1) is initially loaded with 275 g of high-purity silicon pellets and then placed within molybdenum susceptor 162 (FIG. 10) of growth hardware assembly 142. Molybdenum lid 154 and molybdenum shield stack 156 (FIG. 10) are put into place. With growth hardware assembly 142 complete, the upper portion of furnace chamber 100 is lowered into place. The interior of chamber 100 is then evacuated and tested to ensure that chamber 100 is free from leaks to the outside ambient. Upon successful leak-checking, the interior of the chamber is backfilled with an inert atmosphere of argon. Heaters 160 (FIG. 10) are then energized at a power level of 22 kW in order to melt the silicon charge. It takes approximately 45 minutes to raise the temperature of the silicon from room temperature to somewhat above its melting point of 1412° C. Once the silicon is molten, the power to heaters 160 is reduced to approximately 9 kW to maintain the silicon in the molten state. Cooling water to coils 112 (FIG. 3) is then turned on, and these coils are ramped to a power level of 2 kW over a 5 minute period in order to produce a magnetic field strength of 1250 Gs at the center of the silicon melt. 1250 Gs has been found to be adequate to stabilize the growth of dendritic web crystals. For the duration of the crystal growth run, typically two weeks, the field strength remains fixed at 1250 Gs. The growth of a crystal is initiated by dipping dendrite seed 18 (FIG. 1) into the molten silicon and adjusting the temperature of the silicon until seed 18 neither melts nor freezes, but rather "holds" at the melting point of 1412° C. The temperature of the silicon melt is then lowered by several degrees so that silicon begins freezing onto the single crystal seed and solid silicon "wings" grow outward from dendrite seed 18 in a linear fashion at the surface of the melt. When this "wingout" reaches a length of approximately 4 cm, dendrite seed 18 begins to be pulled upward and bounding dendrites are formed at the ends of the "wingout." A film of molten silicon forms between these bounding dendrites and the upper "wingout" and this film freezes to form the thin (100 µm) single crystal silicon ribbon. Adjustments are made to the pulling speed and melt temperature until a steady state is reached in which the web crystal is withdrawn from the melt at a rate of approximately 1.8 cm/min. To compensate for the solid crystal material being withdrawn, the melt is replenished with silicon pellets which are dropped into region 12B (FIG. 1) and melted. The web crystal naturally widens to approximately 6 cm over a length of a few meters, and then remains at that steady-state value for the duration of its growth. Upon termination of a crystal for any of a variety of reasons, another crystal is started as described above. The vertical magnetic field strength is held constant during the entire crystal growth run, which typically lasts for about two weeks. Upon completion of the run, power to the heaters is reduced to zero and the silicon melt freezes. At this time power to the coils 112 is also reduced to zero and chamber is allowed to cool to room temperature for cleaning and the initiation of the next run.

While particular embodiments of the present invention have been shown and described, it can be appreciated to one of ordinary skill in the art, that changes and modifications can be made without departing from the embodiments of this invention in its broader aspects. For example, the advantages offered by the method and system of the present invention apply to, but are not limited to, growth of dendritic web silicon crystal. Dendritic web crystal that includes a multitude of other composition, such as germanium, may also be grown using the method and system of the present invention. Accordingly, the appended claims are to encompass within their scope all such changes, equivalence, and modifications as fall within the true spirit and scope of the embodiments of the present invention.

What is claimed is:

1. A method for manufacturing a semiconductor substrate, comprising:
   (a) producing a melt by melting substrate material within a growth hardware assembly located inside a chamber;
   (b) creating a magnetic field substantially within the chamber by using a magnetic field generator that encircles the perimeter of the chamber; and
   (c) growing the semiconductor substrate from the melt.

2. A dendritic web crystal produced according to the method of claim 1.

3. The method of claim 1, wherein the substrate-grown is dendritic web silicon or dendritic web germanium.

4. The method of claim 1, further comprising:
   (d) significantly containing the magnetic field in the chamber by using a ferromagnetic shell.

5. The method of claim 1, wherein creating a magnetic field substantially within the chamber includes:
   (b)(i) producing a magnetic field in a vertical direction.

6. The method of claim 1, wherein using a magnetic field generator includes:
   (b)(i) encircling the chamber with a coil assembly capable of conducting electrical current.

7. The method of claim 6, further comprising:
   (d) cooling the coil assembly by establishing thermal communication between a cooling plate and the coil assembly.

8. The method of claim 7, wherein cooling the coil assembly includes:
   (d)(i) running water through tubes disposed in the cooling plate for transferring heat generated from electrical current passing through the coil assembly; and
   (d)(ii) electrically isolating the cooling tubes from the coil assembly to substantially eliminate electrolysis.

9. The method of claim 6, wherein the coil assembly is covered with an epoxy resin and wrapped with a fiberglass tape.

10. The method of claim 1, further comprising:
    (d) substantially containing the magnetic field by at least partially enclosing the magnetic field generator with a shell.

11. The method of claim 10, wherein the shell is made from a ferromagnetic material.

12. The method of claim 10, wherein the shell comprises a sheath body having an upper flange extending from one end of the sheath body and a base flange opposing the upper flange and enclosing the other end of the sheath body.

13. The method of claim 12, wherein the shell additionally comprises a field clamp member disposed within the chamber and positioned over the growth hardware assembly, the field clamp member having an opening through which the substrate can be extracted from the growth hardware assembly, and wherein the field clamp member is in magnetic communication with the upper flange, located outside of the chamber.

14. The method of claim 13, wherein a transition ring magnetically couples the upper flange to the field clamp member.

15. The method of claim 14, wherein the chamber comprises:
    an upper chamber cap enclosing a lower chamber body, the upper chamber cap and the lower chamber body being made from a double-wall structure separated by a gap, the gap being used for circulating a cooling fluid within the double-wall structure to remove the heat generated by the chamber, wherein the transition ring is coupled between the upper chamber cap and the lower chamber body, and wherein the transition ring includes openings which are respectively aligned with the gap to allow the cooling fluid to circulate within the double wall structure.

16. The method of claim 10, further comprising:
    (e) supporting the growth hardware assembly with a field shaping plate disposed in the chamber, wherein the field shaping plate has a variable thickness to define a selected geometrical configuration.

17. The method of claim 10, further comprising:
    (e) enhancing the magnetic field over the growth hardware assembly by disposing a field shaping plate in the chamber and supporting the growth hardware assembly.

18. The method of claim 1, further comprising:
(d) controlling the direction of the magnetic field within the chamber by at least partially enclosing the magnetic field generator with a shell.

19. The method of claim 1, further comprising:
(d) enhancing the magnetic field strength at the location of the growth hardware assembly by at least partially enclosing the magnetic field generator with a shell.

20. A method for manufacturing a semiconductor substrate, wherein the substrate grown is dendritic web silicon or dendritic web germanium, comprising:
(a) producing a melt by melting substrate material within a growth hardware assembly located inside a chamber;
(b) creating a magnetic field substantially within the chamber by using a magnetic field generator that encircles the perimeter of the chamber, wherein creating a magnetic field substantially within the chamber includes:
  (b)(i) encircling the chamber with a coil assembly capable of conducting electrical current; and
  (b)(ii) producing a magnetic field in a vertical direction;
(c) cooling the coil assembly by establishing thermal communication between a cooling plate and the coil assembly, wherein cooling the coil assembly includes:
  (c)(i) running water through tubes disposed in the cooling plate for transferring heat generated from electrical current passing through the coil assembly; and
  (c)(ii) electrically isolating the cooling tubes from the coil assembly to substantially eliminate electrolysis; and
(d) growing the semiconductor substrate from the melt.

* * * * *